(12) United States Patent
Shin

(10) Patent No.: US 7,145,381 B2
(45) Date of Patent: Dec. 5, 2006

(54) APPARATUS FOR CONTROLLING A BOOSTED VOLTAGE AND METHOD OF CONTROLLING A BOOSTED VOLTAGE

(75) Inventor: Soon-Kyun Shin, Sungnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 10/772,240

(22) Filed: Feb. 6, 2004

(65) Prior Publication Data

US 2005/0035811 A1    Feb. 17, 2005

(30) Foreign Application Priority Data

Aug. 12, 2003 (KR) .................... 10-2003-0055744

(51) Int. Cl.
*G05F 1/10* (2006.01)
*G05F 3/02* (2006.01)

(52) U.S. Cl. .................................... 327/536

(58) Field of Classification Search ............... 327/536, 327/589; 363/59–60
See application file for complete search history.

(56) References Cited

U.S. PATENT DOCUMENTS 5,546,031 A * 8/1996 Seesink ................. 327/155

| | | | |
|---|---|---|---|
| 6,198,340 B1 * | 3/2001 | Ting et al. ................. 327/536 |
| 6,208,196 B1 * | 3/2001 | St. Pierre .................. 327/536 |
| 6,392,904 B1 * | 5/2002 | Bayer et al. ................ 363/59 |
| 6,445,623 B1 | 9/2002 | Zhang et al. ........ 365/189.11 |
| 6,501,325 B1 * | 12/2002 | Meng ........................ 327/536 |
| 6,534,963 B1 | 3/2003 | Bayer et al. .............. 323/313 |
| 6,734,718 B1 * | 5/2004 | Pan .......................... 327/536 |
| 2002/0008567 A1 * | 1/2002 | Henry ....................... 327/536 |
| 2002/0030534 A1 * | 3/2002 | Myono ...................... 327/536 |
| 2004/0061549 A1 * | 4/2004 | Imamiya .................... 327/536 |

FOREIGN PATENT DOCUMENTS

EP        1 111 763 A2     6/2001
JP        2001-237374      8/2001

OTHER PUBLICATIONS

Korean Office Action, dated Apr. 25, 2005.

* cited by examiner

*Primary Examiner*—Quan Tra
(74) *Attorney, Agent, or Firm*—Harness, Dickey & Pierce, P.L.C.

(57) ABSTRACT

The apparatus for controlling a boosted voltage includes a voltage generating circuit and a control circuit. The voltage generating circuit is configured to generate a boosted voltage from an input voltage based on a control current, and the control circuit is configured to generate the control current based on the boosted voltage.

29 Claims, 6 Drawing Sheets

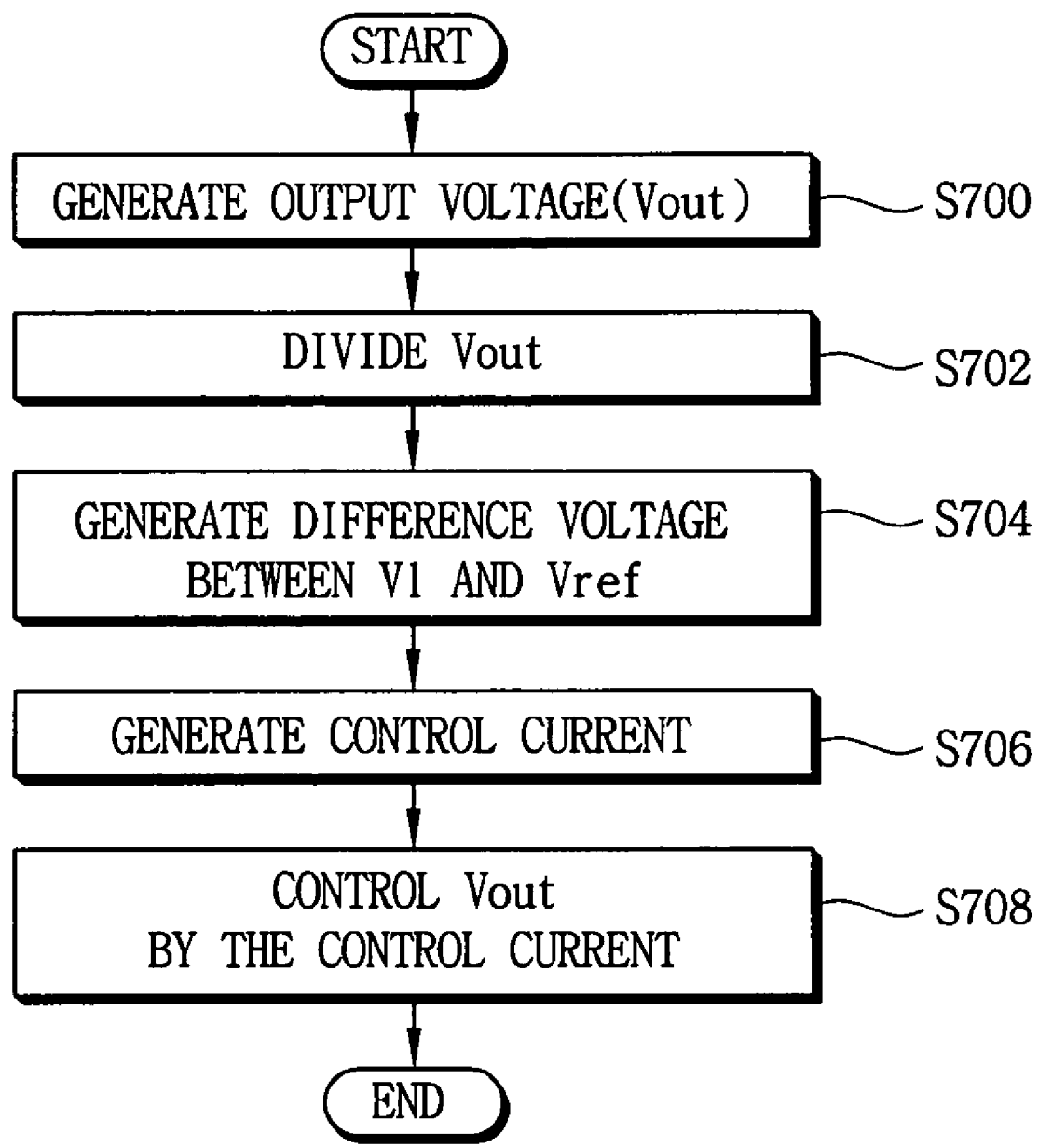

APPARATUS FOR CONTROLLING A BOOSTED VOLTAGE AND METHOD OF CONTROLLING A BOOSTED VOLTAGE

CROSS-REFERENCE TO RELATED APPLICATIONS

This application relies for priority upon Korean Patent Application No. 2003-55744 filed on Aug. 12, 2003, the contents of which are herein incorporated by reference in their entirety.

BACKGROUND OF THE INVENTION

1. Field of the Invention

The present invention relates to an apparatus for controlling a boosted voltage and a method of controlling the boosted voltage.

2. Description of the Related Art

Portable electric devices are provided with a portable power supply such as a battery. The portable power supply usually has a voltage source lower than 3 volts.

Electric devices coupled to the portable electric devices operate using a high voltage source, and thus require a device for boosting the voltage of the portable power supply to a fixed driving voltage.

U.S. Pat. Nos. 6,534,963 and 6,445,623 both disclose conventional apparatuses for boosting voltage. However, the boosted voltages produced by these apparatuses have a large ripple voltage when a large load current flows through the load.

SUMMARY OF THE INVENTION

In the method of controlling a boosted voltage according to the present invention, a boosted voltage is produced from an input voltage based on a control current, and the control current is generated based on the boosted voltage.

In an exemplary embodiment of the apparatus for controlling a boosted voltage according to the present invention, a voltage generating circuit is configured to generate the boosted voltage from the input voltage based on the control current; and a control circuit is configured to generate the control current based on the boosted voltage. The method and apparatus provide a stable voltage level for the boosted voltage, which has reduced ripple.

In one exemplary embodiment, the voltage generating circuit includes first, second, third and fourth switches. A capacitor stores charges corresponding to the input voltage while the first and third switches are turned on, and outputs the boosted voltage while the second and fourth switches are turned on. In this embodiment, a clock signal generator is configured to generate first, second and third clock signals, and a level shifter circuit is configured to selectively change a level of the input voltage in response to the third clock signal to output a switching control signal. The first and second switches are switched in response to first and second clock signals, and the third and fourth switches are switched in response to a switch control signal.

In an exemplary embodiment, the third clock signal has an inverted phase with respect to the first clock signal, a front edge of the second clock signal is delayed by a fixed time with respect to a front edge of the first clock signal, and an active period of the second clock signal is narrower than that of the first clock signal.

In another exemplary embodiment, the control circuit is configured to generate the control current based on the boosted voltage and a desired boosted voltage. For example, the control circuit is configured to generate the control current based on a difference between the boosted voltage and the desired boosted voltage.

In an exemplary embodiment, the control circuit includes a voltage divider configured to divide the boosted voltage to generate a divided voltage and an amplifier configured to amplify a voltage difference between a reference voltage and the divided voltage. For example, the reference voltage represents a desired boosted voltage. A voltage controlled current source in the control circuit is configured to generate the control current based on the amplified difference voltage

BRIEF DESCRIPTION OF THE DRAWINGS

The above and other advantages of the present invention will become more apparent by describing in detail the exemplary embodiments thereof with reference to the accompanying drawings, in which:

FIG. 6 is a flow chart showing a method of controlling the boosted voltage.

DESCRIPTION OF EMBODIMENTS

Hereinafter the exemplary embodiment of the present invention will be described in detail with reference to the accompanying drawings.

Figure 1:
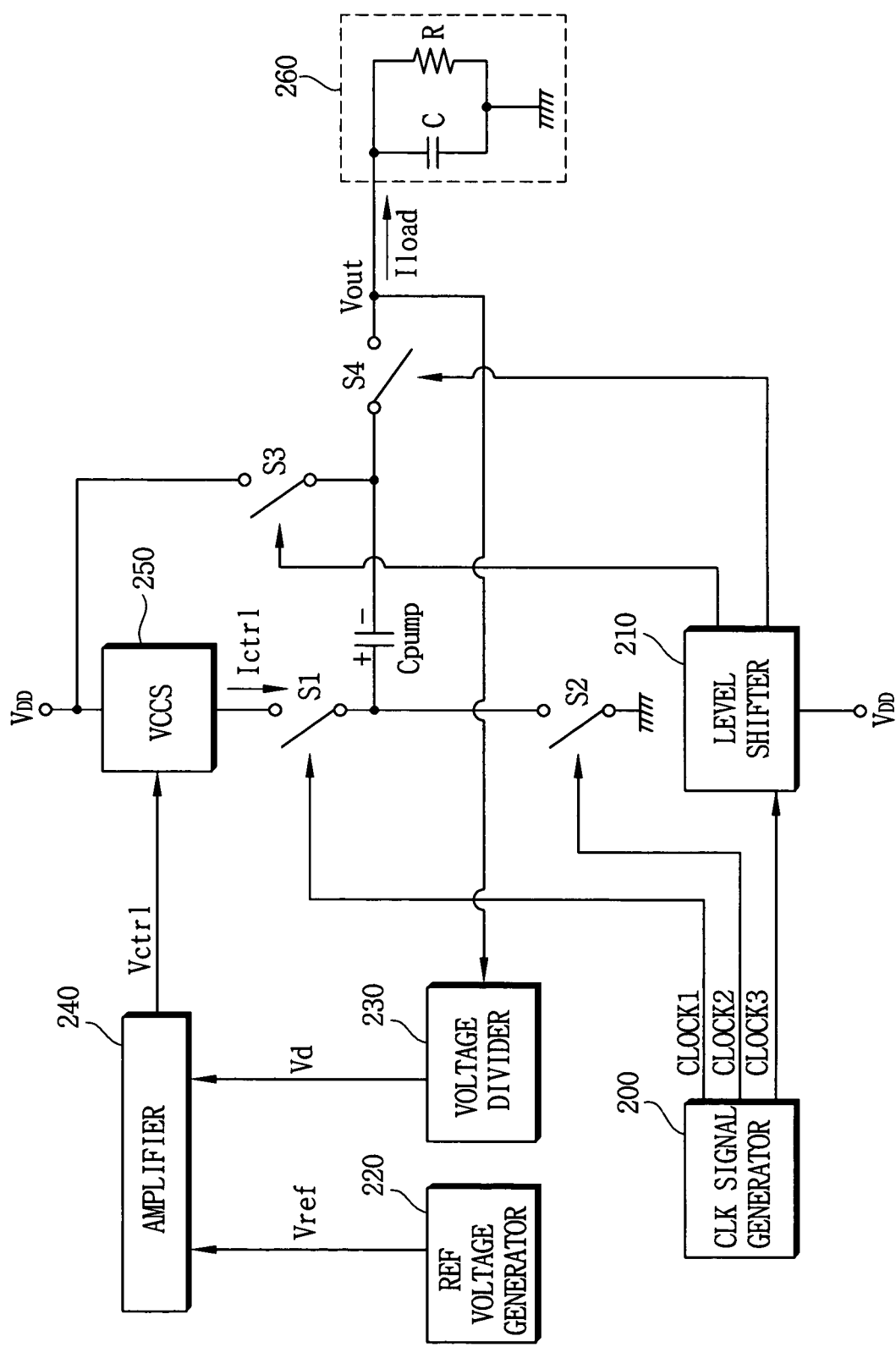
FIG. 1 is a block diagram showing an apparatus for controlling a boosted voltage according to one exemplary embodiment of the present invention.
Figure 2:
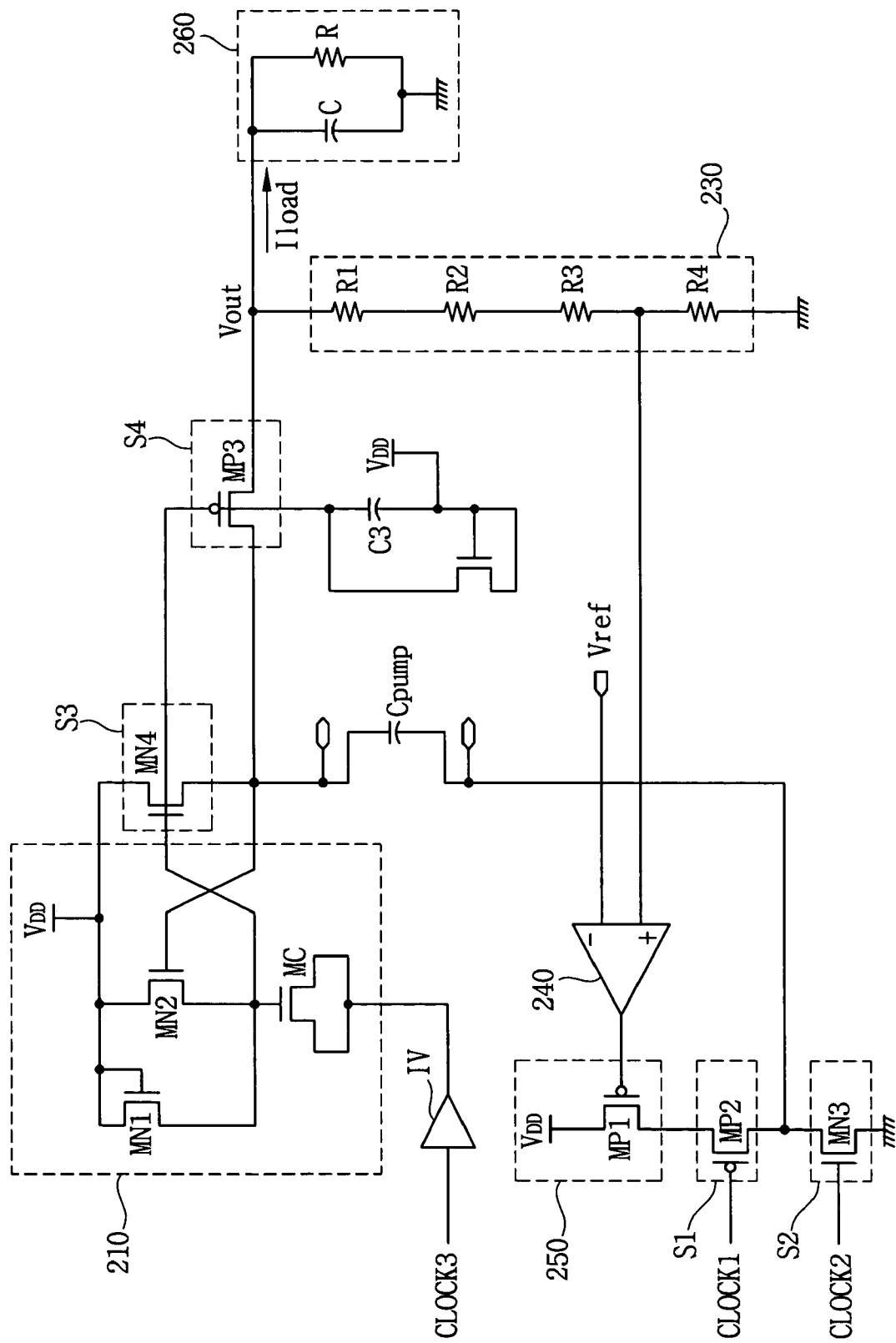
FIG. 2 is an exemplary circuit level diagram of the apparatus illustrated in FIG. 1.

FIG. 1 is a block diagram showing an apparatus for controlling a boosted voltage according to one exemplary embodiment of the present invention, and FIG. 2 is an exemplary circuit level diagram of the apparatus shown in FIG. 1.

Referring to FIGS. 1 and 2, the apparatus for controlling the boosted voltage includes a clock signal generator 200, a level shifter 210, first and second switches S1 and S2, third and fourth switches S3 and S4 and a capacitor Cpump forming a voltage generating circuit generating a boosted voltage (Vout) from an input voltage ($V_{DD}$) based on a control current (Ictrl). The apparatus further includes a reference signal generator 220, a voltage divider 230, an amplifier 240, and a voltage controlled current source (VCCS) 250 forming a control circuit generating the control current Ictrl.

The clock signal generator 200 generates first, second and third clock signals (clock1, clock2, clcok3). The level shifter 210 changes a level of the input voltage $V_{DD}$ in response to the first clock signal clock1 to generate a switching control signal. The reference signal generator 220 generates a reference voltage (Vref) representing the desired boosted voltage. The voltage divider 230 divides boosted voltage Vout to generate a divided voltage (Vd) representing the boosted voltage Vout. The amplifier 240 amplifies a difference voltage between the reference voltage Vref and the divided voltage (Vd) to generate a control voltage (Vctrl). The voltage controlled current source 250 generates the control current Ictrl based on the control voltage Vctrl. The apparatus for controlling the boosted voltage is connected to a load 260 such as a capacitor C and a resistor R connected in parallel to the capacitor C. The boosted voltage Vout is provided to the load 260.

Referring to FIG. 2, the level shifter 210 includes first and second NMOS transistors (MN1, MN2) and a NMOS capacitor (MC). A first current electrode of the first NMOS transistor MN1 receives the input voltage $V_{DD}$, a control or gate electrode of the first NMOS transistor MN1 is connected to the first current electrode of the first NMOS transistor MN1, and a second current electrode of the first NMOS transistor MN1 is connected to the third switch S3. A first current electrode of the second NMOS transistor MN2 receives the input voltage $V_{DD}$, a second current electrode of the second NMOS transistor MN2 is connected to the second current electrode of the first NMOS transistor MN1, and a control or gate electrode of the second NMOS transistor MN2 is connected to the fourth switch S4. A control electrode of the NMOS capacitor MC is connected to the second current electrodes of the first and second NMOS transistors MN1 and MN2.

The voltage divider 230, for example, includes serially connected first, second, third and fourth resistors R1, R2, R3 and R4, and generates the divided voltage Vd based on the resistances of the resistors R1, R2, R3 and R4. In one exemplary embodiment, the resistors R1, R2, R3 and R4 may have the same resistance R. In one exemplary embodiment, the input voltage $V_{DD}$ is about 3 volts, the desired boosted voltage is 5 volts. In this embodiment, the voltage divider 230 produces a divided voltage Vd of about 1.2 volts, which is substantially the same as the reference voltage Vref, when the boosted voltage is 5 volts.

As shown in FIG. 2, in one exemplary embodiment, the amplifier 240 may be a differential amplifier. An inverting (−) terminal of the differential amplifier 240 receives the reference voltage Vref, and a non-inverting (+) terminal of the differential amplifier 240 receives the divided voltage Vd.

In the exemplary embodiment of FIG. 2, the VCCS 250 includes a first PMOS transistor MP1. A control electrode of the first PMOS transistor MP1 receives the output voltage of the differential amplifier 240, a first current electrode of the first PMOS transistor MP1 receives the input voltage $V_{DD}$, and a second current electrode of the first PMOS transistor MP1 is connected to the first switch S1.

The first switch S1, for example, includes a second PMOS transistor MP2. A control electrode of the second PMOS transistor MP2 receives the first clock signal clock 1, a first current electrode of the second PMOS transistor MP2 is connected to the second current electrode of the first PMOS transistor MP1, and a second current electrode of the second PMOS transistor MP2 is connected to the second switch S2.

The second switch S2 includes, for example, a third NMOS transistor MN3. A control electrode of the third NMOS transistor MN3 receives the second clock signal clock2, a second current electrode of the third NMOS transistor MN3 is connected to the second current electrode of the second PMOS transistor MP2, and a first current electrode of the third NMOS transistor MN3 is connected to a reference potential such as ground.

The third switch S3 includes, for example, a fourth NMOS transistor MN4. A second current electrode of the fourth NMOS transistor MN4 receives the input voltage $V_{DD}$, a control electrode of the fourth NMOS transistor MN4 is connected to the second current electrodes of the first and second NMOS transistors MN2 and MN3, and a first current electrode of the fourth NMOS transistor MN4 is connected to the capacitor Cpump.

The fourth switch S4 includes, for example, a third PMOS transistor MP3. A control electrode of the third PMOS transistor MP3 is connected to the control electrode of the fourth NMOS transistor MN4, a first current electrode of the third PMOS transistor MP3 is connected to the control electrode of the second NMOS transistor MN2 and the first current electrode of the fourth NMOS transistor MN4, and a second current electrode of the third PMOS transistor MP3 delivers the output voltage Vout.

A first electrode of the capacitor Cpump is connected to the control electrode of the second NMOS transistor MN2 and the first current electrode of the fourth NMOS transistor MN4. A second electrode of the capacitor Cpump is connected to the second current electrodes of the second and third NMOS transistors MN2 and MN3.

Hereinafter, the operation of the apparatus for controlling the boosted voltage is described.

Figure 3:
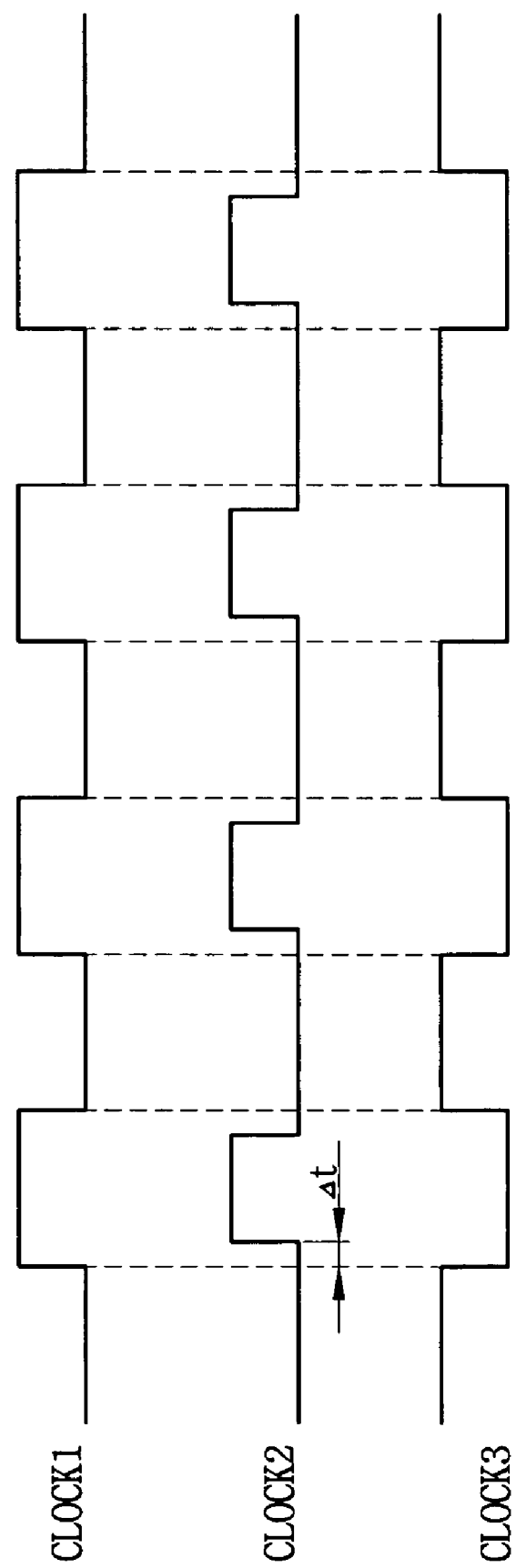
FIG. 3 is a timing diagram showing clock signals of FIG. 1.

The clock signal generator 200 generates the first, second and third clock signals clock1, clock2, clock3. FIG. 3 illustrates an exemplary embodiment of the first, second and third clock signals clock1, clock2, clock3 generated by the clock signal generator 200. As shown, the first clock signal clock1 repeats a high level and a low level with a fixed period. A front edge of the second clock signal clock2 is delayed by a fixed time Δt with respect to a front edge of the first clock signal clock1, and the high level period of the second clock signal clock2 is shorter than that of the first clock signal clock 1 such that the high level of a pulse in the second clock signal clock2 ends before the high level of a corresponding pulse in the first clock signal clock1. The third clock signal clock3 is an inverse of the first clock signal clock1.

The level shifter 210, as shown in FIG. 2, receives an inverted version of the third clock signal clock3 from an inverter IV and changes the level of the input voltage $V_{DD}$ to generate the switch control signal. The switch control signal swings between the level of the input voltage $V_{DD}$ and substantially double ($2V_{DD}$) the level of the input voltage.

The second switch S2 is turned on when the second clock signal clock2 has an active status such as a high level, and the third switch S3 is turned on when the switch control signal has a high level (i.e., substantially $2V_{DD}$). Charges corresponding to the input voltage $V_{DD}$ are charged in the capacitor Cpump when the second and third switches S2 and S3 are turned on because the second and third switches S2 and S3 connect the capacitor Cpump between the input voltage $V_{DD}$ and ground.

The first switch S1 is turned on when the first clock signal clock1 has a non-active status such as a low level, and the fourth switch S4 is turned on when the switch control signal has a low level (i.e., $V_{DD}$). Accordingly, the fourth switch S4 is turned off while the third switch S3 is turned on, and the fourth switch S4 is turned on while the third switch S3 is turned off.

The output voltage Vout, corresponding to the charges charged in the capacitor Cpump, is supplied to the load 260 as the first and fourth switches S1 and S4 are turned on. The fourth switch S4 connect the capacitor Cpump to the load 260, and the first switch S1 connects the capacitor Cpump with the VCCS 250. The VCCS 250 supplies charges to the capacitor Cpump so that the boosted voltage Vout reaches and maintains a desired boosted voltage. The amount of charge supplied to the capacitor Cpump by the VCCS 250 is regulated by the differential amplifier 240. Namely, the differential amplifier 240 regulates the control current Ictrl output by the VCCS 240. The differential amplifier 240 makes the first PMOS transistor MP1 of the VCCS 250 more or less conductive based on the comparison of the divided voltage Vd with the reference voltage Vref (i.e., based on a comparison of the generated boosted voltage to the desired boosted voltage). By controlling the output voltage Vout using a control current Ictrl derived based on the output voltage Vout, the output voltage Vout has the desired stable voltage level (e.g., 5 volts) without ripple.

Figure 4:
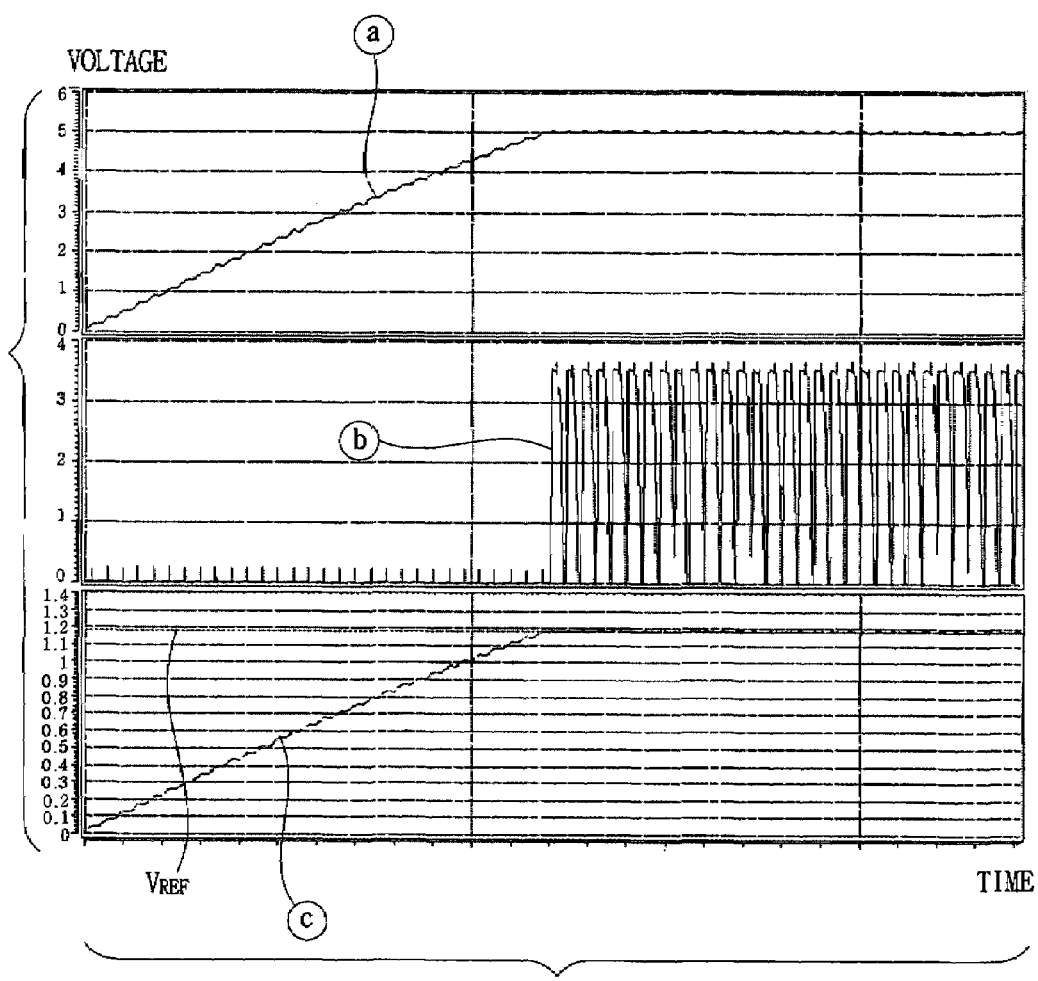
FIG. 4 is a graph showing an output voltage of the apparatus of FIG. 1, an output voltage of a differential amplifier of FIG. 1, and an output of a voltage divider of FIG. 1.

FIG. 4 is a graph showing an output voltage of the apparatus of FIG. 1, an output voltage of a differential amplifier of FIG. 1, and an output of a voltage divider of FIG. 1. Referring to FIG. 4, graph (a) shows variation of the output voltage Vout over time, graph (b) shows variation of the output voltage of the differential amplifier 240 over time, and graph (c) shows variation of the divided voltage Vd over time. In the example of FIG. 4, the desired voltage level for the output voltage is 5 volts.

As shown, the output voltage Vout gradually increases to the desired voltage level of 5 volts and is maintained at 5 volts. The output voltage of the differential amplifier 240 has a minimum voltage level until the output voltage of the differential amplifier 240 reaches 5 volts, and then a regulation operation occurs after the output voltage of the differential amplifier 240 reaches 5 volts.

The voltage divider 230 divides the boosted voltage Vout, and outputs 1.2 volts, which is substantially the same as the reference voltage Vref, of divided voltage Vd when the output voltage Vout reaches the desired voltage level of 5 volts. In one exemplary embodiment, the reference voltage generator 220 generates a constant reference voltage Vref regardless of process voltage and process temperature.

The differential amplifier 240 compares the reference voltage Vref and the divided voltage Vd, amplifies the difference voltage between the reference voltage Vref and the divided voltage Vd, and outputs the difference voltage, also referred to as the control voltage Vctrl. The control voltage Vctrl represents a difference between the generated boosted voltage Vout and the desired boosted voltage.

The differential amplifier 240 outputs a first difference voltage when the reference voltage Vref is higher than the divided voltage Vd, outputs a reference difference voltage when the reference voltage Vref is the same as the divided voltage Vd, and outputs a second difference voltage when the reference voltage Vref is lower than the divided voltage Vd. The first difference voltage is lower than the reference difference voltage, and the second difference voltage is higher than the reference difference voltage.

The divided voltage Vd becomes higher than the reference voltage Vref when the output voltage Vout becomes higher than the desired voltage level (e.g., 5 volts). Thus, the differential amplifier 240 outputs a voltage having level that is higher than the reference difference voltage when the output voltage Vout is higher than the desired voltage level. The divided voltage Vd becomes lower than the reference voltage Vref when the output voltage Vout becomes lower than the desired voltage level (e.g., 5 volts). Thus, the differential amplifier 240 outputs a voltage having a level that is lower than the reference difference voltage when the output voltage Vout is lower than the desired voltage level of 5 volts. The level of the output voltage Vout varies depending upon the load current ($I_{load}$) that flows through the load 260, and the voltage output from the differential amplifier 240 varies depending upon the output voltage Vout. Accordingly, the VCCS 250 compensates for the variation in the output voltage Vout.

Figure 5:
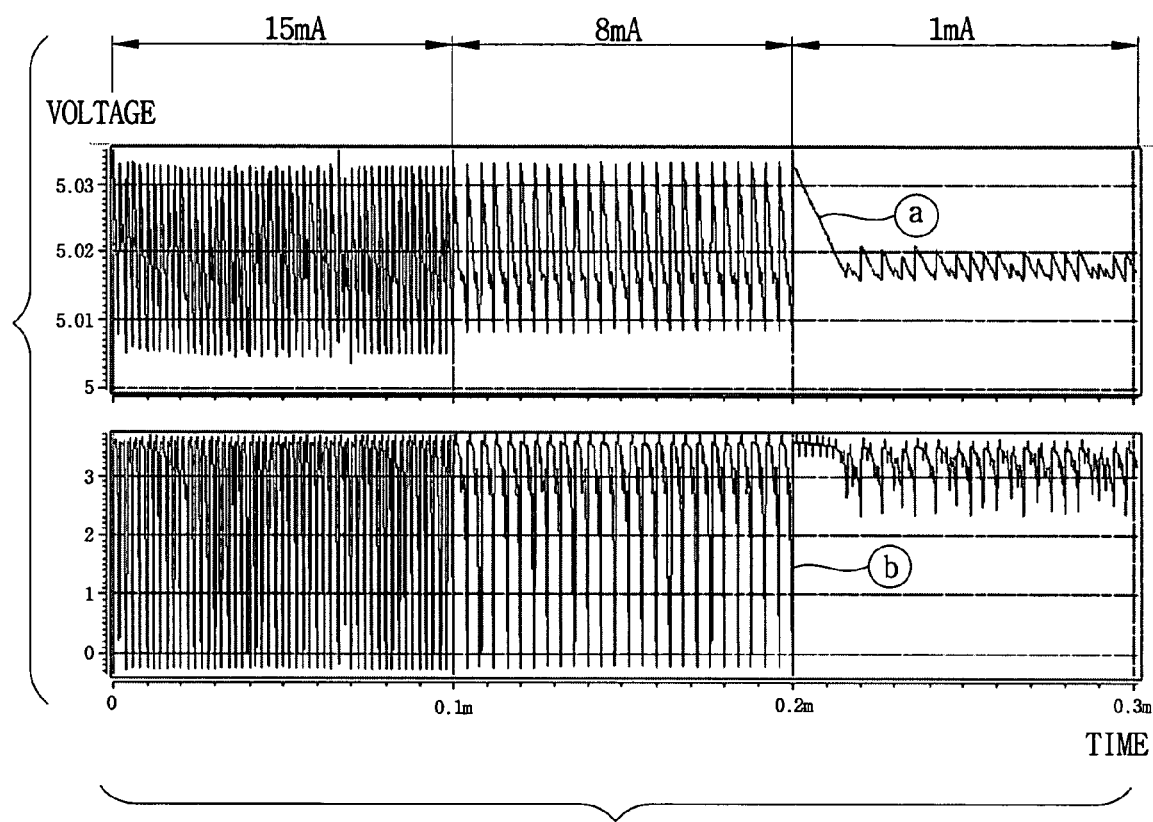
FIG. 5 is a graph showing the output voltage of the apparatus of FIG. 1 and the output voltage of the differential amplifier of FIG. 1 as a load current varies.

FIG. 5 is a graph showing the output voltage of the apparatus of FIG. 1 and the output voltage of the differential amplifier of FIG. 1 as the load current varies.

Referring to FIG. 5, graph (a) shows the output voltage Vout as the load current varies, and graph (b) shows the output voltage of the differential amplifier 240 as the load current varies.

As shown in graph (a) of FIG. 5, the variation of the output voltage Vout is very small when the load current $I_{load}$ has a low level, 1 mA, and the variation of the output voltage Vout increases when the level of the load current $I_{load}$ increases to, for example, 15 mA.

In addition, the difference between the reference voltage Vref and the divided voltage Vd increases as the load current $I_{load}$ changes from 1 mA to 15 mA, and thus the amplitude of the output voltage of the differential amplifier 240 increases. Therefore, the control current Ictrl output from the VCCS 250 increases as the load current $I_{load}$ increases.

The VCCS 250 outputs the control current Ictrl corresponding to the voltage output from the differential amplifier 240. The control current Ictrl regulates the quantity of the charges charged in the capacitor Cpump to maintain the level of the output voltage Vout, thus the output voltage Vout has a stable voltage level.

For example, the differential amplifier 240 outputs the first difference voltage lower than the reference difference voltage when the output voltage Vout is lower than the desired boosted voltage level (e.g., 5 volts). As a result, the control current Ictrl output from the VCCS 250 increases, and the quantity of the charges charged in the capacitor Cpump increases. Therefore, the output voltage Vout increases up to the desired boosted voltage level.

However, the differential amplifier 240 outputs the second difference voltage higher than the reference difference voltage when the output voltage Vout is higher than the desired boosted voltage level of about 5 volts, the control current Ictrl output from the VCCS 250 then decreases, and the quantity of the charges charged in the capacitor Cpump decreases. Accordingly, the output voltage Vout decreases down to the desired boosted voltage level, and the desired level of the output voltage Vout may be maintained.

FIG. 6 is a flow chart showing a method of controlling the boosted voltage. As shown, the output voltage Vout having a fixed boosted voltage level is generated according to the switching operation of the switches S1, S2, S3 and S4, which are turned on/off in response to the clock signals clock1, clock2 and clock3 (step S700). Particularly, the second switch S2 is turned on in response to the second clock signal clock2, the third switch S3 is turned on in response to the third clock signal clock3, and the charges corresponding to the input voltage $V_{DD}$ are charged in the capacitor Cpump. The first switch S1 is turned on in response to the first clock signal clock1, the fourth switch S4 is turned on in response to the switch control signal that is generated in response to the third clock signal clock3, and the output voltage Vout corresponding to the charges in the capacitor Cpump are provided to the load 260.

The voltage divider 230 divides the output voltage Vout (step S702), and the differential amplifier 240 compares the divided voltage Vd and the reference voltage Vref to generate the difference voltage therebetween (step S704).

The divided voltage Vd becomes higher than the reference voltage Vref when the output voltage Vout is higher than the desired voltage level (e.g., 5 volts). The divided voltage Vd becomes lower than the reference voltage Vref when the output voltage Vout is lower than the desired voltage level (e.g., 5 volts). Thus, the differential amplifier 240 outputs a voltage having a level that is lower than the reference difference voltage when the output voltage Vout is lower than the desired voltage level. The differential amplifier 240 outputs a voltage having a level that is higher than the reference difference voltage when the output voltage Vout is higher than the desired voltage level.

The level of the output voltage Vout varies depending upon the load current $I_{load}$ that flows through the load 260, and thus the voltage output from the differential amplifier 240 varies depending upon the output voltage Vout.

The VCCS 250 generates the control current Ictrl corresponding to the voltage outputted from the differential amplifier 240. The control current Ictrl regulates the quantity of the charges charged in the capacitor Cpump, and thus the output voltage Vout is maintained at a desired voltage level with reduced ripple voltage (step S706).

The level of the output voltage Vout is controlled by means of the control current (step S708). Particularly, the quantity of the control current Ictrl is decreased when the output voltage Vout is higher than the desired boosted voltage level, and the quantity of the control current Ictrl is increased when the output voltage Vout is lower than the desired boosted voltage level, so that the level of the output voltage Vout may be maintained.

While the exemplary embodiments of the present invention and its advantages have been described in detail, it should be understood that various changes, substitutions and alterations may be made herein without departing from the scope of the invention.

What is claimed is:

1. An apparatus for controlling a boosted voltage, comprising:
   a voltage generating circuit configured to generate a boosted voltage from an input voltage based on a control current and charges stored in a charge storing element, and configured to receive the control current while the charges stored in the charge storing element are used to generate the boosted voltage; and
   a control circuit configured to generate the control current based on the boosted voltage; wherein
   the voltage generating circuit further includes,
      a clock signal generator configured to generate first, second and third clock signals,
      a level shifter circuit configured to selectively change a level of the input voltage in response to the third clock signal to output a switching control signal, and wherein
   first and second switches switched in response to the first and second clock signals, and
   third and fourth switches switched in response to the switching control signal.

2. The apparatus of claim 1, wherein the voltage generating circuit comprises:
   a capacitor; and wherein
   the switching structure is configured to selectively store charges corresponding to the input voltage in the capacitor, and to selectively output the stored charges in conjunction with charges corresponding to the control current as the boosted voltage.

3. The apparatus of claim 2, wherein the control circuit is configured to generate the control current based on a difference between the boosted voltage and a desired boosted voltage.

4. The apparatus of claim 1, wherein the voltage generating circuit further comprises:
   a capacitor configured to store charges corresponding to the input voltage while the second and third switches are turned on, and outputting the boosted voltage while the first and fourth switches are turned on.

5. The apparatus of claim 1, wherein
   the third clock signal has an inverted phase with respect to the first clock signal;
   a front edge of the second clock signal is delayed by a fixed time with respect to a front edge of the first clock signal; and
   an active period of the second clock signal is narrower than that of the first clock signal.

6. The apparatus of claim 1, wherein the level shifter includes a metal-oxide silicon (MOS) capacitor.

7. The apparatus of claim 1, wherein the switch control signal swings between the level of the input voltage and substantially double the level of the input voltage.

8. The apparatus of claim 7, wherein the fourth switch is turned on during a non-active status of the switching control signal, and the third switch is turned on during an active status of the switching control signal.

9. The apparatus of claim 1, wherein the control circuit is configured to generate the control current based on the boosted voltage and a desired boosted voltage.

10. The apparatus of claim 1, wherein the control circuit is configured to generate the control current based on a difference between the boosted voltage and the desired boosted voltage.

11. The apparatus of claim 1, wherein the control circuit comprises:
    a voltage divider configured to generate a divided voltage from the boosted voltage;
    a comparator configured to compare the divided voltage with a reference voltage; and
    a current generator configured to generate the control current based on output from the comparator.

12. The apparatus of claim 11, wherein the reference voltage represents a desired boosted voltage.

13. The apparatus of claim 1, wherein the control circuit comprises:
    a voltage divider configured to divide the boosted voltage to generate a divided voltage;
    an amplifier configured to amplify a difference voltage between a reference voltage and the divided voltage; and
    a voltage controlled current source configured to generate the control current based on the amplified difference voltage.

14. The apparatus of claim 13, wherein the reference voltage represents a desired boosted voltage.

15. The apparatus of claim 13, wherein voltage controlled current source decreases the control current when the divided voltage is higher than the reference voltage, and increases the control current when the divided voltage is lower than the reference voltage.

16. The apparatus of claim 2, wherein the switching structure is configured to selectively receive the control current while configured to selectively output the stored charges.

17. The apparatus of claim 16, wherein the switching structure includes a switch configured to selectively connect a portion of the control circuit generating the control current with the capacitor.

18. The apparatus of claim 2, wherein the voltage generating circuit is configured to not receive the control current when charges are stored in the capacitor.

19. The apparatus of claim 4, wherein the first switch is configured to connect a portion of the control circuit generating the control current with the capacitor when turned on.

20. The apparatus of claim 1, wherein the first switch is configured to connect a portion of the control circuit generating the control current with the capacitor when turned on.

21. The apparatus of claim 20, wherein
the third clock signal has an inverted phase with respect to the first clock signal;
a front edge of the second clock signal is delayed by a fixed time with respect to a front edge of the first clock signal; and
an active period of the second clock signal ends before that of the first clock signal.

22. A method for controlling a boosted voltage, comprising:
generating a boosted voltage from an input voltage based on a control current and charges stored in a charge storing element, the generating of a boosted voltage including,
generating first, second and third clock signals,
selectively changing a level of the input voltage to output a switching control signal based on the third clock signal from the clock signal generator,
storing charges corresponding to the input voltage in the charge storing element when a second and third switch are turned on and outputting the stored charges in conjunction with charges corresponding to a control current as the boosted voltage a first and fourth switch are turned on, the first and second switches being turned on in response to the first and second clock signal, and the third and fourth switches being turned on in response to the switching control signal,
generating the control current based on the boosted voltage; and
supplying the control current for generating the boosted voltage while the charges stored in the charge storing element are used to generate the boosted voltage.

23. The method of claim 22, wherein the generating the control current step generates the control current based on a difference between the boosted voltage and a desired boosted voltage.

24. The method of claim 22, wherein the generating the control current step generates the control current based on the boosted voltage and a desired boosted voltage.

25. The method of claim 24, wherein the generating the control current step generates the control current based on a difference between the boosted voltage and the desired boosted voltage.

26. The method of claim 22, wherein the generating the control current step comprises:
generating a divided voltage from the boosted voltage by dividing the boosted voltage;
a comparing the divided voltage with a reference voltage; and
generating the control current based on output from the comparing step.

27. The method of claim 26, wherein the reference voltage represents a desired boosted voltage.

28. The method of claim 22, wherein the generating the control current step comprises:
dividing the boosted voltage to generate a divided voltage;
amplifying a difference voltage between a reference voltage and the divided voltage; and
generating the control current based on the amplified difference voltage.

29. The method of claim 28, wherein the reference voltage represents a desired boosted voltage.

* * * * *